United States Patent [19]

Cham et al.

[11] Patent Number: 4,894,694
[45] Date of Patent: Jan. 16, 1990

[54] MOSFET STRUCTURE AND METHOD FOR MAKING SAME

[75] Inventors: Kit M. Cham, Sunnyvale; Paul V. Voorde, Mountain View, both of Calif.

[73] Assignee: Hewlett-Packard Company, Palo Alto, Calif.

[21] Appl. No.: 146,068

[22] Filed: Jan. 20, 1988

Related U.S. Application Data

[62] Division of Ser. No. 926,318, Oct. 31, 1986, Pat. No. 4,746,624.

[51] Int. Cl.$^4$ .............................................. H01L 29/78
[52] U.S. Cl. .................................... 357/23.3; 357/91; 357/89
[58] Field of Search ........................... 357/23.3, 91, 89

[56] References Cited

U.S. PATENT DOCUMENTS

| | | | |
|---|---|---|---|
| 4,356,623 | 11/1982 | Hunter | 357/23.3 |
| 4,697,198 | 9/1987 | Komori et al. | 357/23.3 |
| 4,729,001 | 3/1988 | Haskell | 357/23.3 |

Primary Examiner—Joseph E. Clawson, Jr.

[57] ABSTRACT

A MOSFET structure characterized by a lightly doped tip region located between the channel and drain, and a buried region located below the tip region and shifted laterally towards the drain. The buried region, which is doped to a level intermediate between that of the tip region and the drain, causes the channel current to deflect downwardly from the field oxide, through the lightly doped tip region, and into the buried region. The gradual electric field gradient produced by the structure and the deflection of the channel current away from the thin oxide greatly reduces the device's sensitivity to the hot electron effect. The method of the invention includes forming the lightly doped tip region, forming a first oxide spacer, forming the buried region, widening the oxide spacer, and finally forming the drain region.

5 Claims, 2 Drawing Sheets

MOSFET STRUCTURE AND METHOD FOR MAKING SAME

CROSS REFERENCE TO RELATED APPLICATION

This is a division of application Ser. No. 926,318, filed 10/31/86 now U.S. Pat. No. 4,746,624.

BACKGROUND OF THE INVENTION

1. Field of the Invention

This invention relates generally to integrated circuits, and more particularly to MOSFET structures for integrated circuits.

2. Description of the Prior Art

A common type of integrated circuit device is the metal-oxide field-effect transistor (MOSFET). A MOSFET includes a source region, a drain region, a channel region extending between the source and drain regions, and a gate structure provided over the channel region. The gate structure includes a conductive gate, and a thin oxide layer separating the gate from the channel region.

Operationally, a biasing potential is provided between the source and drain regions of a MOSFET. The standard MOSFET source/drain bias voltage for most integrated circuits is five volts. When a control voltage is applied to the gate, a depletion zone can be formed within the channel region, permitting current to flow from the source region to the drain region. Thus, the MOSFET can serve as a switch responsive to the level of the control voltage applied to the gate.

A troublesome phenomenon known as the "hot electron effect" occurs as a MOSFET is made smaller. When a MOSFET is reduced in size, the distance between the source region and the drain region becomes smaller and, assuming a constant source/drain bias voltage, the electric field strength near the drain region increases dramatically. The high electric field strength accelerates the electrons rapidly, resulting in the formation of "hot" electrons. The hot electrons tend to become trapped in the thin oxide layer of the gate structure in the vicinity of the drain region. As charge accumulates in the thin oxide, the threshold voltage of the MOSFET changes, and the speed and efficiency of the MOSFET can be greatly reduced.

In FIG. 1, a prior art MOSFET structure which reduces the hot electron effect includes lightly doped tips at the source and drain regions. Since the drain tip is more lightly doped than the drain region itself, the electric field near the channel is softened. In consequence, the channel current will not produce as many hot electrons, reducing the hot electron effect. This prior art structure is known as a "lightly doped drain" or "LDD" structure.

While the prior art structure of FIG. 1 reduces the hot electron effect, it does not completely eliminate it. Another prior art structure known as the "buried lightly doped drain" or "BLDD" structure, which is a slight improvement over the LDD structure, is shown in FIG. 2. Like the LDD structure, the BLDD structure includes a pair of lightly doped tips near the source region and drain region of the transistor. However, the BLDD additionally includes a pair of buried implant regions beneath the tip regions of the transistor which are more lightly doped than the drain and source regions, but which are more heavily doped than the tip regions The drain buried implant region causes the channel current to deflect downwardly because it has a lower resistance than the drain tip region.

Theoretically, the downward deflection of the channel current with BLDD structure reduces the number of hot electrons collecting in the thin oxide. However, since the buried implant region is more heavily doped than the lightly doped regions, the electric field strength of the BLDD structure is larger than the electric field generated with the structure of FIG. 1, causing a greater acceleration of the electrons of the channel current As a result, the immunity of the BLDD structure to the hot electron effect is only slightly better than the immunity of the LDD structure.

A problem with the BLDD structure is the potential for "punch-through" where current flows between the buried implant regions, as indicated in broken lines in FIG. 2. If this happens, the MOSFET will have excessive leakage current and will not be fully responsive to the control voltage applied to the gate.

The LDD and BLDD structures can be manufactured by similar processes. For example, a polysilicon gate can be first formed over the thin oxide layer. Then, the lightly doped tip regions can be formed by ion implantation. The tip regions protrude into the channel region due primarily to a "side scattering" effect. For the BLDD structure, the buried implant regions can next be formed by high-energy ion implantation. The buried implant regions extend even further into the channel region because the high energy required for the buried implant regions increases the side scattering effect. Next, for both the LDD and BLDD devices, oxide spacers are formed along the sides of the polysilicon gate, and the source and drain regions are formed by ion implantation. Again, the source and drain regions protrude toward the channel region due to the side scattering effect.

SUMMARY OF THE INVENTION

An object of this invention is to produce a MOSFET structure which is relatively immune from the hot electron effect.

Another object of this invention is to provide a simple, economical, and reliable process for producing submicron MOSFET structures.

Briefly, the MOSFET structure of the present invention includes a drain tip region located between the channel region and the drain region of the transistor, and a drain buried region located below the drain tip region and shifted laterally towards the drain region. The drain buried region is less heavily doped than the drain region, and the drain tip region is less heavily doped than the buried region. The MOSFET structure may optionally include a substantially intrinsic drain blocking region located between the drain tip region and the drain region but above the drain buried region. The MOSFET structure of the present invention causes the channel current to be deflected away from the thin oxide layer and into the drain buried region.

The method of the present invention includes the steps of forming a gate structure over a channel region of a semiconductor substrate, forming tip regions in the substrate, forming spacers against the gate structure, implanting buried regions into the substrate, widening the spacers, and forming the source and drain regions. The method may also include the step of forming blocking regions between the tip regions and the source and drain regions.

An advantage of the present invention is that it provides a MOSFET structure with substantially greater immunity to the hot electron effect than conventional, LDD, and BLDD MOSFET structures.

Another advantage of this invention is that it provides an easy, reliable, and repeatable method for producing sub-micron MOSFET structures.

These and other objects and advantages of the present invention will be apparent to those skilled in the art after reading the following descriptions and studying the various figures of the drawing.

DETAILED DESCRIPTION OF THE PREFERRED EMBODIMENT(S)

Figure 1:
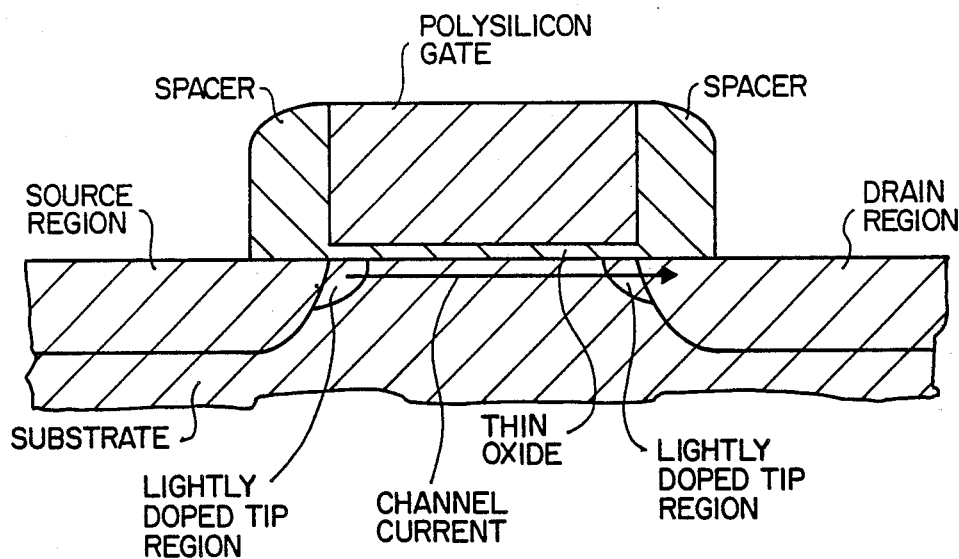
FIG. 1 is a cross-sectional view of a prior art lightly doped drain (LDD) MOSFET structure.
Figure 2:
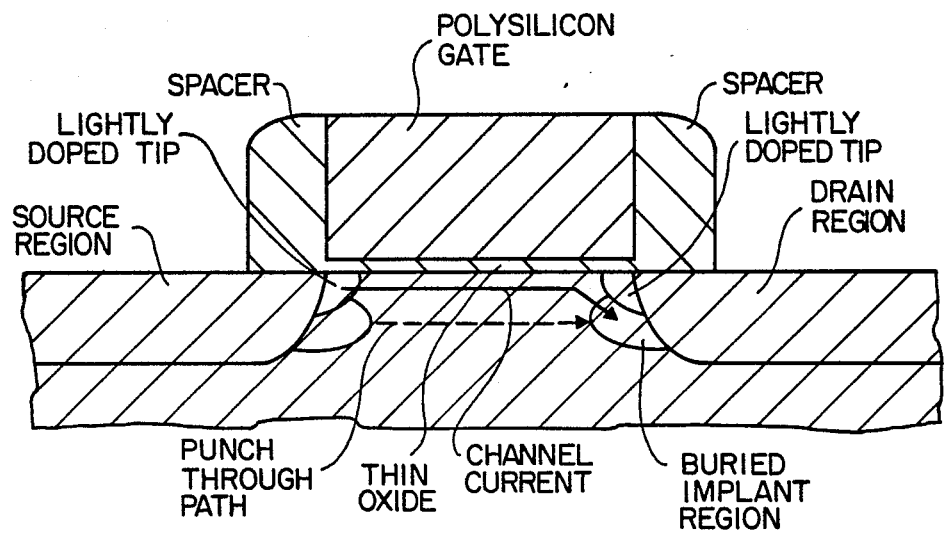
FIG. 2 is a cross-sectional view of a prior art buried, lightly doped drain (BLDD) MOSFET structure.
Figure 3:
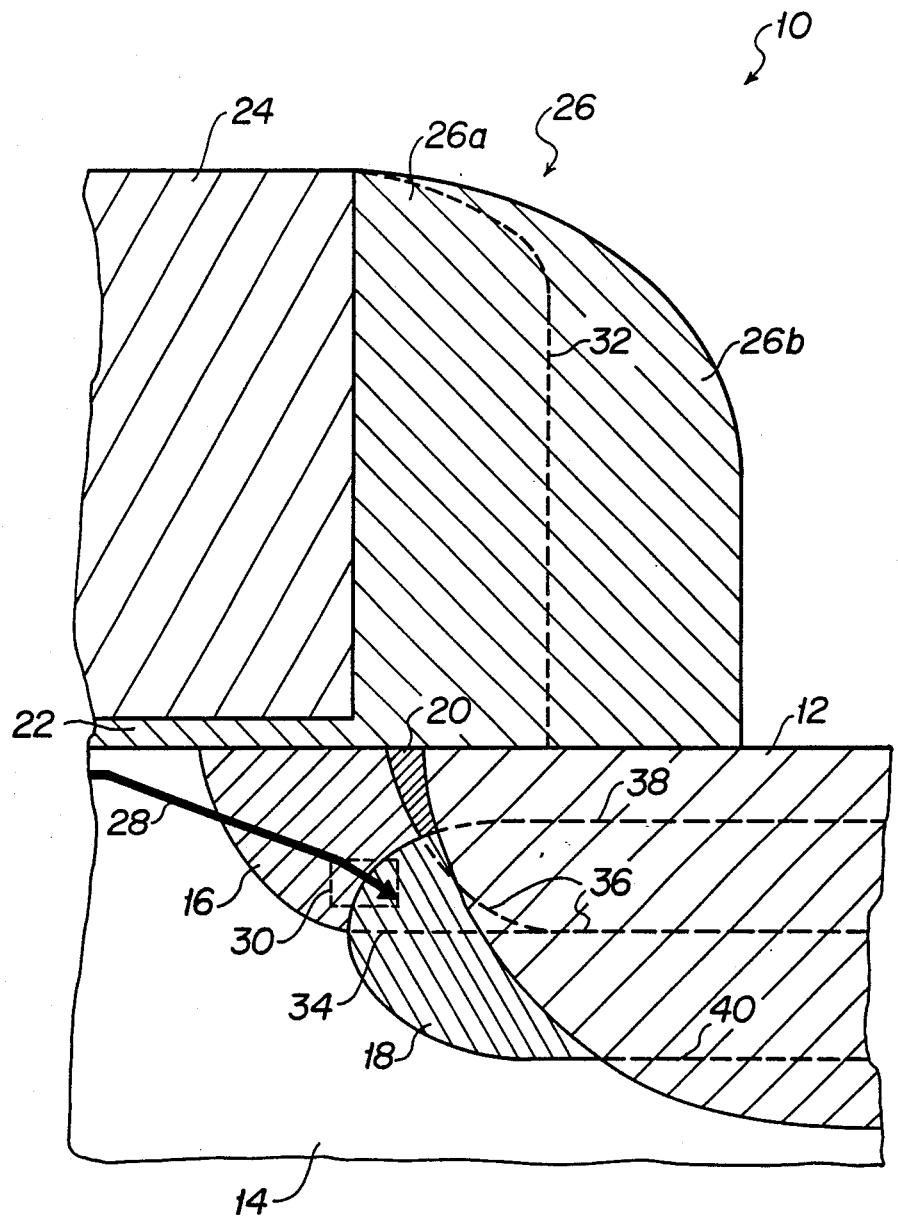
FIG. 3 is a partial, cross-sectional view of a shifted, buried, lightly doped drain (SBLDD) MOSFET structure in accordance with the present invention.

FIGS. 1 and 2 illustrate prior art MOSFET structures which have reduced sensitivity to the hot electron effect than standard MOSFET structures FIG. 3 illustrates a shifted, buried, lightly doped drain (SBLDD) MOSFET structure 10 in accordance with the present invention which exhibits less sensitivity to the hot electron effect and less leakage than the prior art structures of FIGS. 1 and 2.

In FIG. 3, a portion of the SBLDD structure 10 near the drain region 12 is shown. The SBLDD structure near the source region is not shown, but is substantially a mirror image of that which is shown in FIG. 3. It is therefore intended that a discussion of the various regions proximate the drain region 12 serve as a fully enabling disclosure of the various regions proximate to the source region of the structure.

The drain region 12 is a n+ region formed in a p-type substrate 14. Also formed in the substrate 14 is a tip region 16, an implanted buried region 18, and a blocking region 20. Formed above the substrate 14 is a thin oxide layer 22, a polysilicon gate 24, and an oxide spacer 26.

As mentioned previously, the drain region 12 is a heavily doped n+ region having approximately $10^{20}$ impurity atoms per cubic centimeter The tip region 16 is an n—— region, and is provided with approximately $10^{\sim}$ impurity atoms per cubic centimeter. The implanted, buried region 18 is an n— region having approximately five times the number of impurity atoms per cubic centimeter as tip region 16. Thus, it can be seen that the doping level of the implanted, buried region is between that of the tip region 16 and the drain region 12. Arsenic (AS) is a suitable n-type dopant.

Blocking region 20 is preferably intrinsic, i.e., the same conductivity as an undoped silicon substrate, although it may also be slightly n-type or slightly p-type. In either case, the resistivity of blocking region 20 is higher than the resistivities of drain region 12, tip region 6, and implanted buried region 18. The blocking region 20 can be created by implanting p-type impurities such as $BF_2$ after the formation of a spacer 26a.

As indicated by arrow 28, the channel current is deflected downwardly from the thin oxide layer 22 towards a region 30 of maximum electric field located within the tip region 16. Since the channel current is deflected away from the thin oxide layer, the chance of a hot electron becoming trapped at the oxide is greatly reduced. Furthermore, since the channel current path is directed through the tip region 16 before it enters the buried region 18, the electric field is reduced, greatly reducing the chance of hot electron formation. Thus, the structure of the present invention reduces the hot electron effect in two ways, namely, by first producing fewer hot electrons and secondly, by deflecting electrons away from the thin oxide layer.

It should be noted that the buried region 18 is shifted laterally towards the drain region 12 relative to the protruding end of the tip region 16. This lateral shift is important in that it causes the channel current path to pass through the tip region 16 prior to entering the more heavily doped buried region 18. Furthermore, by shifting the buried region 18 laterally toward the drain region 12, the chance of punch-through between the buried region 18 and the corresponding buried region near the source region of the device is greatly reduced.

Blocking region 20 further ensures that the channel current is deflected away from the thin oxide 22 due to its relatively high resistivity The size of blocking region 20 can be determined by controlling the amount and energy of the implant, but care should taken not to increase the blocking region 20 to a point where it pinches off the current path to the buried region 18.

It should be noted that while the blocking region 20 is helpful in defining the channel current path near the drain region, certain embodiments of the present invention do not include a blocking region For these embodiments, the tip regions 16 and the laterally shifted buried regions are relied upon to reduce the hot electron effect.

The method of the present invention is also discussed with reference to FIG. 3. First, a suitably doped and prepared substrate is prepared, and the thin oxide layer 22 and polysilicon gate 24 are formed over a channel region of the substrate. Then, the tip regions are formed by ion implantation, by projecting a beam of phosphorous ions against the upper surface of substrate 14. The tip 16 extends beneath the thin oxide 22 and polysilicon gate 24 due to the aforementioned side scattering effect. Next, side spacers 26a having the perimeter 32 are formed, such as by Low Pressure Chemical Vapor Deposition (LPCVD) and antisotropic etching. Subsequently, a high-energy arsenic ion implant is used to form the buried region 18, which protrudes into the channel region due to the side scattering effect. Also, in certain embodiments of this invention, the blocking region 20 can be formed with a low dose ($10^{13}/cm^2$), and low energy $BF_2$ implant. Finally, a second or widened spacer 26b is formed, such as by LPCVD and anisotropic etching, and the drain region 12 and source region are implanted.

The original boundary of the implant which forms tip region 16 is shown by broken line 34, while the original boundary of the implant which forms blocking region 20 is shown by broken line 36. The original boundaries caused by the high energy implant which created buried region 18 are shown by broken lines 38 and 40.

From the foregoing, it should be clear that the key to producing a lateral shift in the buried region 18 is to implant the buried region after the oxide spacer 26a is formed, but before oxide spacer 26b is formed. In this way, the buried region 18 is shifted relative to tip region 16, and the drain region 12 is shifted relative to buried region 18. By extending this method, any number of relatively shifted regions can be formed.

It should be noted that many publications describe the details of common techniques used in the fabrication process of integrated circuit components. See, for example, *Semiconductor and Integrated Circuit Fabrication Techniques,* published by Preston Publishing Co., Inc. These techniques can be generally employed in the fabrication of the structures of the present invention. Moreover, the individual manufacturing steps can be performed using commercially available integrated circuit fabrication machines As specifically necessary to an understanding of the present invention, approximate technical data for the preferred embodiments are set forth based upon current technology Future developments in this art may call for appropriate adjustments, as would be obvious to one skilled in the art.

While this invention has been described with reference to several preferred embodiments, it is contemplated that various alterations and permutations of the invention will become apparent to those skilled in the art upon a reading of the preceding descriptions and a study of the drawing. It is therefore intended that the scope of the present invention be determined by the following appended claims.

What is claimed is:

1. A MOSFET structure comprising:
   a source region, a drain region, a channel region located between said source region and said drain region, and gate means disposed over said channel region;
   a tip region disposed between said channel region and said drain region, said tip region having a lower conductivity than said drain region;
   a buried region disposed below said tip region and shifted laterally towards said drain region relative said tip region, said buried region having a higher conductivity than said tip region but a lower conductivity than said drain region; and
   a blocking region disposed between said tip region and said drain region and above said buried region, said blocking region having a lower conductivity than said tip region,
   wherein said source region, said drain region, said tip region and said buried region are all p-type regions.

2. A MOSFET structure comprising:
   a source region, a drain region, a channel region located between said source region and said drain region, and gate means disposed over said channel region;
   a tip region disposed between said channel region and said drain region, said tip region having a lower conductivity than said drain region;
   a buried region disposed below said tip region and shifted laterally towards said drain region relative said tip region, said buried region having a higher conductivity than said tip region but a lower conductivity than said drain region; and
   a blocking region disposed between said tip region and said drain region and above said buried region, said blocking region having a lower conductivity than said tip region,
   wherein said source region, said drain region, said tip region, and said buried region are all n-type regions.

3. A MOSFET structure as recited in claim 2 wherein said blocking region is an n-type region.

4. A MOSFET structure comprising:
   a source region, a drain region, a channel region located between said source region and said drain region, and gate means disposed over said channel region;
   a tip region disposed between said channel region and said drain region, said tip region having a lower conductivity than said drain region;
   a buried region disposed below said tip region and shifted laterally towards said drain region relative said tip region, said buried region having a higher conductivity than said tip region but a lower conductivity than said drain region, said source, drain, tip and buried regions being n-type regions; and
   a substantially intrinsic blocking region disposed between said tip region and said drain region and above said buried region, said blocking region having a lower conductivity than said tip region.

5. A MOSFET structure comprising:
   a source region, a drain region, a channel region located between said source region and said drain region, and gate means disposed over said channel region;
   a tip region disposed between said channel region and said drain region, said tip region having a lower conductivity than said drain region;
   a buried region disposed below said tip region and shifted laterally towards said drain region relative said tip region, said buried region having a higher conductivity than said tip region but a lower conductivity than said drain region, said source, drain, tip and buried regions being n-type regions; and
   a p-type blocking region disposed between said tip region and said drain region and above said buried region, said blocking region having a lower conductivity than said tip region.

* * * * *

UNITED STATES PATENT AND TRADEMARK OFFICE
CERTIFICATE OF CORRECTION

PATENT NO. : 4,894,694

DATED : Jan. 16, 1990

INVENTOR(S) : Kit M. Cham; Paul Vande Voorde

It is certified that error appears in the above-identified patent and that said Letters Patent is hereby corrected as shown below:

Column 2, line 11, "current As a" should read -- current. As a --

Column 3, line 47, "centimeter The" should read -- centimeter. The --

Column 3, line 49, "10~" should read -- $10^{18}$ --

Column 4, line 22, "resistivity The" should read --resistivity. The--

Column 4, line 31, "region For" should read -- region. For --

Column 5, line 10, "machines As" should read -- machines. As --

Column 5, line 13, "technology Future" should read -- technology. Future --

Signed and Sealed this

Twenty-sixth Day of February, 1991

*Attest:*

HARRY F. MANBECK, JR.

*Attesting Officer*   *Commissioner of Patents and Trademarks*